US008482101B2

(12) United States Patent
Benoit et al.

(10) Patent No.: US 8,482,101 B2
(45) Date of Patent: Jul. 9, 2013

(54) BIPOLAR TRANSISTOR STRUCTURE AND METHOD INCLUDING EMITTER-BASE INTERFACE IMPURITY

(75) Inventors: John J. Benoit, Williston, VT (US); Mattias E. Dahlstrom, Burlington, VT (US); Mark D. Dupuis, South Burlington, VT (US); Peter B. Gray, Jericho, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 12/488,899

(22) Filed: Jun. 22, 2009

(65) Prior Publication Data
US 2010/0320571 A1 Dec. 23, 2010

(51) Int. Cl.
H01L 29/66 (2006.01)
(52) U.S. Cl.
USPC ......................................................... 257/565
(58) Field of Classification Search
USPC .............. 257/565, E29.174, E21.37; 438/345
See application file for complete search history.

(56) References Cited

U.S. PATENT DOCUMENTS

| | | | | |
|---|---|---|---|---|
| 6,331,467 | B1* | 12/2001 | Brown et al. | 438/270 |
| 6,436,782 | B2* | 8/2002 | Chantre et al. | 438/350 |
| 6,541,346 | B2 | 4/2003 | Malik | |
| 7,049,681 | B2 | 5/2006 | Ohnishi et al. | |
| 7,202,136 | B2 | 4/2007 | Lanzerotti et al. | |
| 7,268,413 | B2 | 9/2007 | Ahn et al. | |
| 7,601,629 | B2* | 10/2009 | Ramappa et al. | 438/619 |
| 2004/0110354 | A1* | 6/2004 | Natzle et al. | 438/365 |
| 2004/0188802 | A1* | 9/2004 | Babcock et al. | 257/565 |
| 2005/0250289 | A1 | 11/2005 | Babcock et al. | |
| 2007/0105330 | A1* | 5/2007 | Enicks et al. | 438/337 |
| 2007/0111428 | A1* | 5/2007 | Enicks et al. | 438/235 |
| 2008/0258134 | A1* | 10/2008 | Mears et al. | 257/15 |

OTHER PUBLICATIONS

Williams, J.D., et al., "Epitaxial regrowth of n+ and p+ polycrystalline silicon layers given single and double diffusions", J. Appl. Phys., Oct. 1, 1992, pp. 3169-3178, vol. 72, No. 7.
Sugii, T., et al., "Si Hetero-Bipolar Transistor with a Fluorine-Doped SiC Emitter and a Thin, Highly Doped Epitaxial Base", IEEE Transactions of Electron Devices, Nov. 1990, pp. 2331-2335, vol. 37, No. 11.
Moiseiwitsch, N.E., et al., "The Benefits of Fluorine in pnp Polysilicon Emitter Bipolar Transistors", IEEE Transactions of Electron Devices, Jul. 1994, pp. 1249-1256, vol. 41, No. 7.

* cited by examiner

Primary Examiner — Eugene Lee
Assistant Examiner — Elias M Ullah
(74) Attorney, Agent, or Firm — Scully, Scott, Murphy & Presser, P.C.; Anthony J. Canale

(57) ABSTRACT

A bipolar transistor structure and a method for fabricating the bipolar transistor structure include: (1) a collector structure located at least in-part within a semiconductor substrate; (2) a base structure contacting the collector structure; and (3) an emitter structure contacting the base structure. The interface of the emitter structure and the base structure includes an oxygen impurity and at least one impurity selected from the group consisting of a fluorine impurity and a carbon impurity, to enhance performance of a bipolar transistor within the bipolar transistor structure. The impurities may be introduced into the interface by plasma etch treatment, or alternatively a thermal treatment followed by an anhydrous ammonia and hydrogen fluoride treatment, of a base material from which is comprised the base structure.

16 Claims, 5 Drawing Sheets

US 8,482,101 B2

BIPOLAR TRANSISTOR STRUCTURE AND METHOD INCLUDING EMITTER-BASE INTERFACE IMPURITY

BACKGROUND

The invention relates generally to bipolar transistor structures, and methods for fabrication thereof. More particularly, the invention relates to bipolar transistor structures that provide bipolar transistor devices with enhanced performance, and methods for fabrication thereof.

Semiconductor structures include semiconductor substrates within and upon which are formed semiconductor devices such as but not limited to resistors, transistors, diodes and capacitors. The semiconductor devices are connected and interconnected using patterned conductor layers that are separated by dielectric layers.

In addition to conventional field effect transistor structures that are used within the context of semiconductor circuits, semiconductor circuits may also commonly include alternative transistor structures, such as but not limited to bipolar transistor structures. Bipolar transistors are often desirable within the context of semiconductor circuits insofar as bipolar transistors often operate at elevated switching speeds in comparison with field effect transistors.

Bipolar transistors in general differ in comparison with field effect transistors insofar as bipolar transistors operate within the context of charge carrier transfer through semiconductor junctions, while field effect transistors operate within the context of charge carrier transfer incident to an electric field gradient imposed within a semiconductor substrate by a gate that is isolated from the semiconductor substrate by a gate dielectric. Thus, while field effect transistor performance is often influenced by a gate-to-gate dielectric interface or a gate dielectric-to-semiconductor channel interface characteristics, bipolar transistor performance is often influenced by an emitter-to-base junction interface or base-to-collector junction interface characteristics.

Thus desirable are bipolar transistor structures and devices, and methods for fabricating bipolar transistor structures and devices, that provide bipolar transistors having enhanced performance due to optimized junction interface characteristics.

BRIEF SUMMARY

In one embodiment, a bipolar transistor structure and a method for fabricating the bipolar transistor structure are provided. The bipolar transistor structure and the related method include an impurity at an emitter-to-base junction interface that provides for enhanced performance of a bipolar transistor device that comprises the bipolar transistor structure. The impurity comprises an oxygen impurity, and at least one of a fluorine impurity and a carbon impurity. The impurity may be incorporated at the emitter-to-base junction interface while using methods including but not limited to reactive ion etch plasma etch methods, chemical etch methods and combinations of reactive ion etch plasma etch methods and chemical etch methods.

A particular bipolar transistor structure in accordance with an embodiment of the invention includes a semiconductor substrate including a collector structure. This particular bipolar transistor structure also includes a base structure contacting the collector structure. This particular bipolar transistor structure also includes an emitter structure contacting the base structure. An interface between the emitter structure and the base structure includes: (1) an oxygen impurity; and (2) at least one other impurity selected from the group consisting of a fluorine impurity and a carbon impurity.

A particular method for fabricating a bipolar transistor structure in accordance with an embodiment of the invention includes forming at least in-part within a semiconductor substrate a collector structure. The method also includes forming a base structure contacting the collector structure. The method also includes forming an emitter structure contacting the base structure. An interface between the emitter structure and the base structure includes: (1) an oxygen impurity; and (2) at least one impurity selected from the group consisting of a fluorine impurity and a carbon impurity.

DETAILED DESCRIPTION

The invention, which includes a bipolar transistor structure and a plurality of methods for fabricating the bipolar transistor structure, is understood within the context of the description set forth below. The description set forth below is understood within the context of the drawings described above. Since the drawings are intended for illustrative purposes, the drawings are not necessarily drawn to scale.

Figure 1:
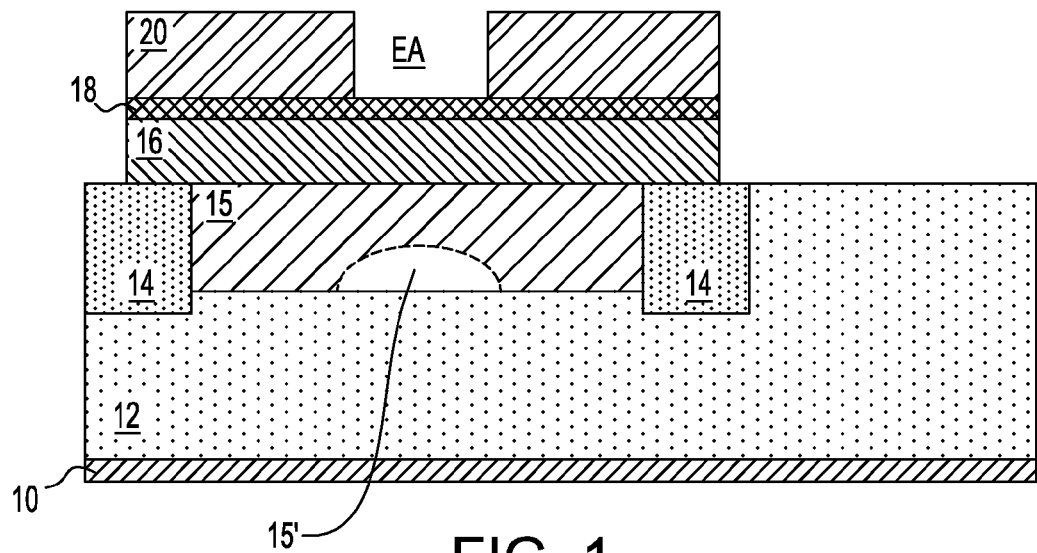
FIG. 1 shows a schematic cross-sectional diagram illustrating a bipolar transistor structure at a point in semiconductor structure processing prior to processing in accordance with an embodiment of the invention.

FIG. 1 shows a schematic cross-sectional diagram of a bipolar transistor structure at an early stage in the fabrication thereof in accordance with an embodiment of the invention. The bipolar transistor structure whose schematic cross-sectional diagram is illustrated in FIG. 1 provides a base structure for further processing of a plurality of bipolar transistor structures in accordance with a plurality of embodiments of the invention.

FIG. 1 shows a base semiconductor substrate 10. An epitaxial sub-collector layer 12 is located and formed upon the base semiconductor substrate 10. A plurality of isolation regions 14 is located and formed embedded within the epitaxial sub-collector layer 12. Located and formed within the epitaxial sub-collector layer 12 interposed between a pair of the plurality of isolation regions 14, but not an adjoining portion of the epitaxial collector layer 12, is a collector region 15. Located and formed contacting the collector region 15 and bridging to the isolation regions 14 is a base layer 16. Located and formed upon the base layer 16 is a dielectric capping layer 18. Located and formed upon the dielectric capping layer 18 is an emitter isolation layer 20 that defines an emitter aperture EA at the bottom of which is exposed a portion of the dielectric capping layer 18.

Within the bipolar transistor structure of FIG. 1, the collector region 15 may be regarded as a "collector structure" within the context of the claimed invention. Similarly, the base layer 16 may be regarded as a "base structure" within the context of the claimed invention. As will be illustrated within the context of further description below, the processing methodology provides for an enhanced emitter-to-base interface for an emitter layer (i.e., that may alternatively be regarded as an "emitter structure" within the context of the claimed invention) located and formed into the emitter aperture EA after having at least in-part stripped from, or treated at, the bottom of the emitter aperture EA a portion of the dielectric capping layer 18.

Each of the forgoing layers and structures that comprise the bipolar transistor structure whose schematic cross-sectional diagram is illustrated in FIG. 1 may comprise materials and have dimensions that are otherwise generally conventional in the semiconductor fabrication art. Each of the forgoing layers and structures that comprise the bipolar transistor structure whose schematic cross-sectional diagram is illustrated in FIG. 1 may additionally be formed using methods and materials that are otherwise generally conventional in the semiconductor fabrication art.

The base semiconductor substrate 10 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 comprises a silicon semiconductor material that has a thickness from 0.05 to 1 millimeter.

Although this particular embodiment illustrates the invention within the context of a nominally bulk semiconductor substrate that comprises the base semiconductor substrate 10, this particular embodiment, and the invention, are not intended to be so limited. Rather, this particular embodiment, and the invention, may alternatively be practiced using a semiconductor-on-insulator semiconductor substrate as the base semiconductor substrate 10. Such a semiconductor-on-insulator substrate would otherwise result from incorporation of a buried dielectric layer within a thickness of the base semiconductor substrate 10. The embodiment also contemplates for the base semiconductor substrate 10 use of a hybrid orientation (HOT) substrate that has multiple crystallographic orientation regions supported within a single semiconductor substrate.

The epitaxial sub-collector layer 12 may comprise any of several epitaxial semiconductor materials that may be selected from the same group of semiconductor materials from which is comprised the base semiconductor substrate 10. The epitaxial sub-collector layer 12 and the base semiconductor substrate 10 may comprise the same or different semiconductor materials, with the same or different dopant polarities and dopant concentrations, but implicitly, if not explicitly, with the same crystallographic orientation. Typically, the epitaxial sub-collector layer 12 includes an appropriate dopant at a concentration form 5E15 to 1E19 dopant atoms per cubic centimeter.

The isolation regions 14 may comprise any of several dielectric isolation materials Non-limiting examples of such dielectric isolation materials may include, but are not necessarily limited to, oxides, nitrides and oxynitrides, particularly of silicon, but oxides, nitrides and oxynitrides of other elements are not excluded. The isolation regions 14 may comprise a crystalline or a non-crystalline dielectric isolation material. The isolation regions 14 may be formed using any of several methods. Non-limiting examples include ion implantation methods, thermal or plasma oxidation or nitridation methods, chemical vapor deposition methods and physical vapor deposition methods. Typically, the isolation regions 14 comprise an oxide of the semiconductor material from which is comprised the base semiconductor substrate 10 or the epitaxial sub-collector layer 12. Typically, each of the isolation regions 14 is located and formed embedded within the epitaxial sub-collector layer 12 to a depth from 50 to 500 nanometers, and with a linewidth from 100 to 1000 nanometers.

The collector region 15 (which may also include a selective collector implant outlined by phantom line 15') comprises a matching semiconductor material as the epitaxial sub-collector layer 12, and is otherwise appropriately doped with an appropriate dopant of the same polarity as the polarity used for the epitaxial sub-collector layer 12.

The base layer 16, which comprises a semiconductor material that may be selected from the same group of semiconductor materials as the base semiconductor substrate 10, comprises a monocrystalline semiconductor material on the portion situated on top of the collector region 15, and a polycrystalline semiconductor material on the portion situated outside the collector region 15 (i.e., if the semiconductor material is grown on monocrystalline Si then it is monocrystalline, if the semiconductor material is grown on oxide or poly-Si— then it is polycrystalline). Such a base layer 16 is typically formed using an epitaxial method, and in particular an epitaxial chemical vapor deposition method, that is otherwise generally conventional in the semiconductor fabrication art. Typically, the base layer 16 comprises a silicon-germanium alloy semiconductor material having a germanium content from 1 to 30 weight percent, and a thickness from 3 to 50 nanometers, when the epitaxial sub-collector layer 12 and the collector region 15 comprise a silicon semiconductor material.

The dielectric capping layer 18 comprises a dielectric capping material. Suitable dielectric capping materials may include, but are not necessarily limited to, silicon oxide, silicon nitride and silicon oxynitride dielectric capping materials. Dielectric capping materials predicated upon alternative elements are not precluded. Such dielectric capping materials may be formed using methods including but not limited to chemical vapor deposition methods and physical vapor deposition methods. Typically, the dielectric capping layer 18 comprises a silicon oxide dielectric capping material that has a thickness from 2 to 50 nanometers.

The emitter isolation layer 20 comprises an emitter isolation material that in turn comprises a dielectric material that may be selected from the same group of dielectric materials as the isolation regions 14 or the dielectric capping layer 18. However, the emitter isolation layer 20 and the dielectric capping layer 18 typically and preferably comprise different dielectric materials to provide appropriate etch selectivity properties. Such a dielectric material for the emitter isolation layer may again be formed using methods and materials that are otherwise generally conventional in the semiconductor fabrication art and also used for forming the dielectric capping layer 18. Typically, the emitter isolation layer 20 comprises a silicon nitride dielectric material when the dielectric capping layer 18 comprises a silicon oxide dielectric material. Typically, the emitter isolation layer 20 has a thickness from 10 to 50 nanometers and defines the emitter aperture EA that has a linewidth from 80 to 800 nanometers.

As a non-limiting process sequence to fabricate the bipolar transistor structure of FIG. 1, the epitaxial sub-collector layer 12 is first epitaxially grown upon the base semiconductor substrate 10 while using an otherwise generally conventional epitaxial chemical vapor deposition method. Dopant inclusion may be in-situ or by subsequent ion implantation. The plurality of isolation regions 14 may then be located and formed embedded within the epitaxial collector layer 12 while first using an appropriate etch method, that will typically comprise a plasma etch method, for forming a plurality of isolation trenches which are subsequently filled with the isolation regions 14. The particular isolation regions 14 may then be located and formed embedded within the isolation trenches while using a blanket layer deposition and subsequent planarizing method. Mechanical planarizing methods and chemical mechanical polish planarizing methods are common. Chemical mechanical polish planarizing methods are typically more common, and generally preferred. The resulting bipolar transistor structure with the isolation regions 14 may then be selectively masked and the collector region 15 located and formed within the epitaxial sub-collector layer 12 interposed between a pair of isolation regions while using an ion implantation method.

Upon this resulting intermediate bipolar transistor structure may then be successively layered precursor layers to: (1) the base layer 16; (2) the dielectric capping layer 18; and (3) the emitter isolation layer 20. The foregoing stack of precursor layers may then be patterned to provide: (1) the base layer 16; (2) the dielectric capping layer 18; and (3) an additional precursor layer to the emitter isolation layer 20. Finally, this additional precursor layer to the emitter isolation layer 20 may be patterned to form the emitter isolation layer 20, thus providing the bipolar transistor structure of FIG. 1.

As is understood by a person skilled in the art, the bipolar transistor structure of FIG. 1 may be fabricated as an NPN bipolar transistor structure or a PNP bipolar transistor structure. Within the context of semiconductor materials selections designated above, an NPN bipolar transistor structure may under certain circumstances be preferred.

Figure 2:
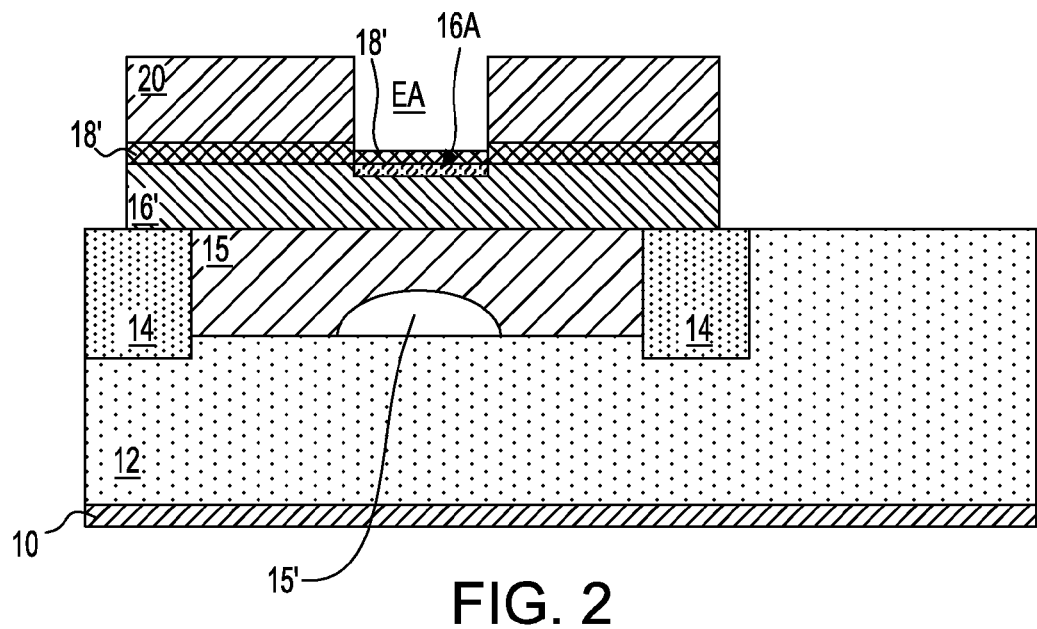
FIG. 2 shows a schematic cross-sectional diagram illustrating the results of over-etch processing of a dielectric capping layer when forming an emitter aperture within the bipolar transistor structure of FIG. 1.

FIG. 2 shows the results of etching partially or fully through the dielectric capping layer 18 to form a dielectric capping layer 18', and also impacting an underlying portion of the base layer 16 to form a base layer 16' that includes a damaged region 16A at the base of the emitter aperture EA, while using the emitter isolation layer 20 as a mask.

The foregoing etching may be undertaken using etch methods including but not limited to dry plasma etch methods and wet chemical etch methods. However, this particular embodiment of the invention that comprises a first embodiment of the invention contemplates a plasma etch method that uses an etchant gas composition that includes at least one of an oxygen containing material, a fluorine containing material and a carbon containing material that will leave at least one of an oxygen impurity, a fluorine impurity and a carbon impurity within the damaged region 16A at the base of the emitter aperture EA.

More particularly, such a plasma etch method may use an oxygen containing etchant gas (such as but not limited to oxygen, ozone, nitrous oxide or nitric oxide) and a fluorocarbon containing etchant gas (such as but not limited to a perfluorocarbon or a hydrofluorocarbon having up to at least five carbon atoms).

Particular plasma etch conditions for etching the dielectric capping layer 18 to form the dielectric capping layer 18' and the base layer 16' that includes the damaged region 16A may include, but are not necessarily limited to: (1) a reactor chamber pressure from 220 mTorr or greater; (2) a base semiconductor substrate 10 (and overlying layers) temperature from 10 to 80 degrees centigrade; (3) a source radio frequency power from 50 to 800 watts and a bias from 300 to 1000 V; (4) an oxidant gas flow from 5 to 50 standard cubic centimeter per minute; (5) a fluorocarbon gas flow rate from 1 to 20 standard cubic centimeters per minute; (6) an inert carrier gas flow rate from 0 to 100 standard cubic centimeters per minute; and (7) an over-etch time from 1 to 20 seconds with respect to an endpoint that may be determined using conventional methods, such as but not limited to optical detection methods.

Within the context of the instant embodiment, the foregoing plasma etch process conditions are intended to provide an oxygen impurity, and also at least one of a fluorine impurity and a carbon impurity within the damaged region 16A within the base layer 16' at the location of the emitter aperture EA. The oxygen impurity is present at a concentration from 2E14 to 10E14 impurity atoms per square centimeter and more preferably from 4E14 to 6E14 impurity atoms per square centimeter. At least one of the fluorine impurity and the carbon impurity is present at a concentration from 2E12 to 1E14 impurity atoms per square centimeter and more preferably from 1E13 to 5E13 impurity atoms per square centimeter. Such an oxygen impurity, a fluorine impurity or a carbon impurity is intended as present only within the depth of the base layer 16' at the damaged region 16A.

This particular embodiment also contemplates that a buffered aqueous hydrofluoric acid etchant (i.e., 1:10 to 1:100 dilution) treatment or dilute aqueous hydrofluoric acid etchant (i.e., 1:10 to 1:100 dilution) treatment of the bipolar transistor structure of FIG. 2 may be incorporated after the foregoing reactive ion etch plasma etching, and prior to further processing of the bipolar transistor structure of FIG. 2, to assist in achieving or sustaining the above impurity levels. Such a buffered or dilute hydrofluoric acid treatment may be provided at a temperature from 20 to 80 degrees centigrade for a time period from 0.1 to 10 minutes.

Figure 3:
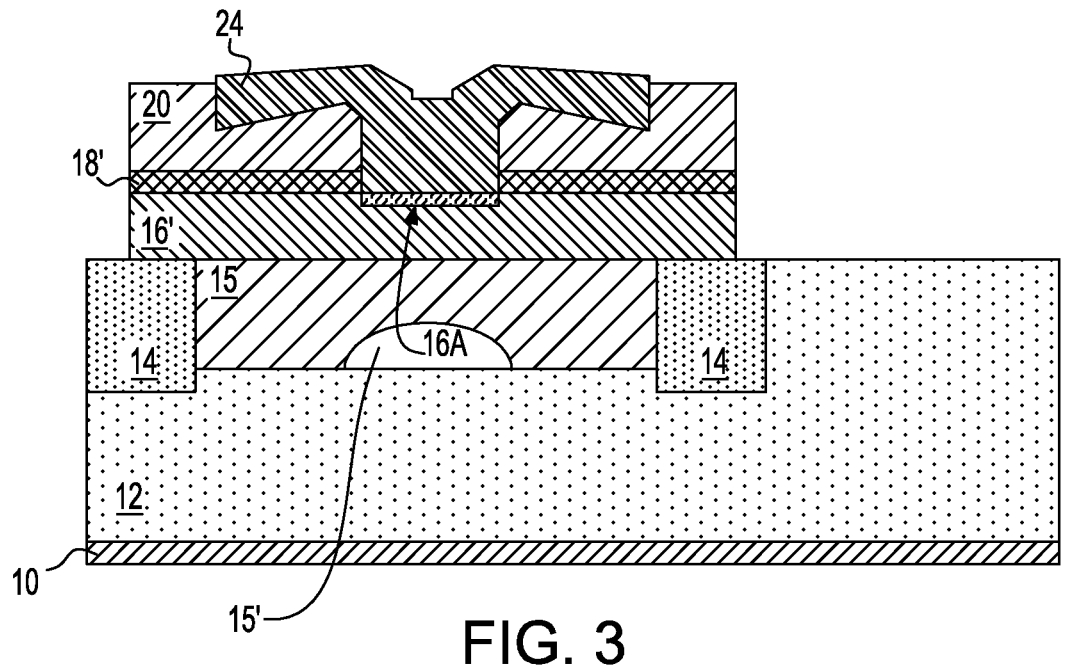
FIG. 3 shows an emitter structure located and formed within the bipolar transistor structure of FIG. 2 to provide a bipolar transistor structure in accordance with a particular embodiment of the invention.

FIG. 3 shows an emitter layer 24 located and formed into the emitter aperture EA and contacting the impurity laden damaged region 16A portion of the base layer 16' that is exposed within the emitter aperture EA, to thus form a completed bipolar junction transistor in accordance with this particular embodiment of the invention, that comprises a first embodiment of the invention.

The emitter layer 24 may comprise any of several semiconductor emitter materials. Included in particular, but also not limiting, are silicon semiconductor emitter materials, such as but not limited to polysilicon emitter materials that include an appropriate dopant at a concentration from 1E19 to 5E20 dopant atoms per cubic centimeter. Such polysilicon emitter materials may be formed using methods including but not limited to chemical vapor deposition methods and physical vapor deposition methods. Typically, the emitter layer 24 comprises a doped polysilicon emitter material that has a thickness from 40 to 200 nanometers.

FIG. 3 shows a schematic cross-sectional diagram of a bipolar transistor structure in accordance with a particular embodiment of the invention that comprises a first embodiment of the invention. The bipolar transistor structure includes a base structure that in turn includes a base layer 16' located and formed upon and parallel to a collector region 15 and beneath an emitter isolation layer 20 that defines an emitter aperture EA that exposes a portion of the base layer 16' that includes a damaged region 16A that includes an oxygen impurity, and at least one of a fluorine impurity and a carbon impurity at a concentrations designated above. The particular oxygen, fluorine and carbon impurities are not uniformly or non-uniformly distributed throughout the foregoing base layer 16' (i.e., which comprises a base structure) or the emitter layer 24 (i.e., which comprises an emitter structure), but rather are localized to the interface between the base structure and the emitter structure.

Figure 4:
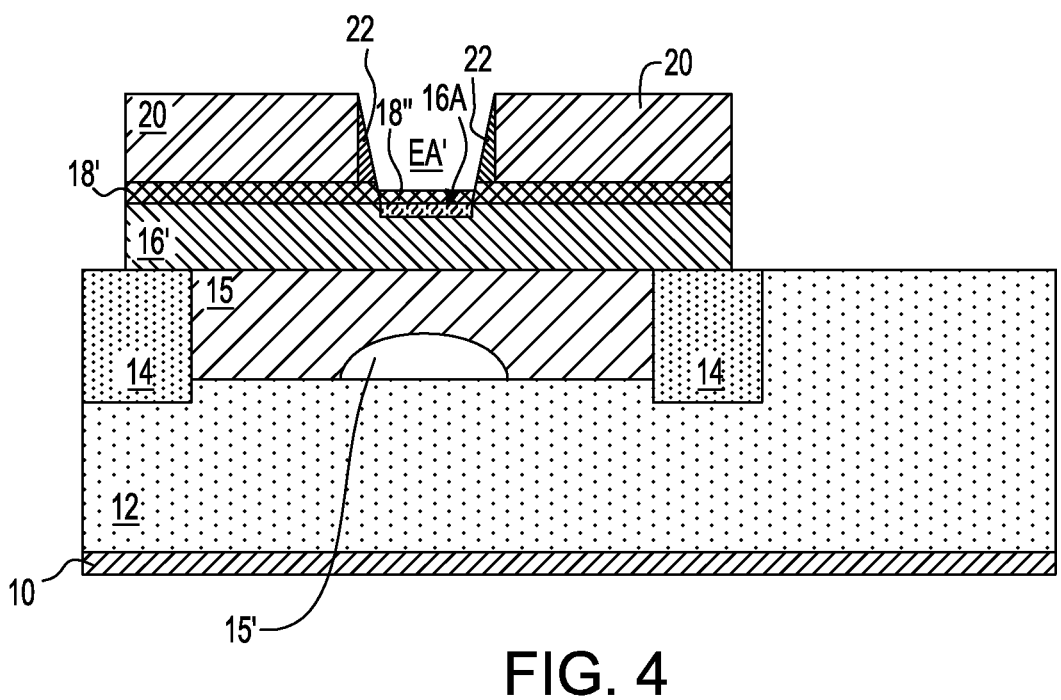
FIG. 4 shows a schematic cross-sectional diagram illustrating the results of over-etch processing of a dielectric capping layer when forming an emitter aperture including an emitter aperture spacer within the bipolar transistor structure of FIG. 1.

FIG. 4 shows an alternative structure that can be used in fabricating a bipolar transistor structure in accordance with another embodiment of the invention. This other embodiment of the invention in turn comprises an alternative first embodiment of the invention.

FIG. 4 in particular shows a spacer 22 (i.e., which is illustrated as plural layers in cross-section, but intended as a single annular layer in plan-view) located and formed adjacent and adjoining a sidewall of the emitter isolation layer 20. The spacer 22 may comprise the same or different dielectric spacer material in comparison with the emitter isolation layer 20. Within this alternative first embodiment of the invention, the emitter isolation layer 20 is first formed with the emitter aperture EA that is illustrated within the schematic cross-sectional diagram of FIG. 1. A spacer material layer is then located and formed upon the resulting bipolar transistor structure, and the spacer material layer is anisotropically plasma etched to form the spacer 22. Similarly with the first embodiment of the invention, subsequent to forming the spacer 22, the dielectric capping layer 18 is etched partially (as shown) or fully to form the dielectric capping layer 18', and to provide the base layer 16' that includes the damaged region 16A impurity treated and laden portion at the base of an emitter aperture EA'. The partially etched dielectric capping layer is labeled as 18" in FIG. 4.

The plasma etch conditions that are used in the first embodiment for forming base layer 16' as is illustrated in FIG. 2 may also be used within this alternate first embodiment as is illustrated in FIG. 4, presuming that the emitter isolation layer 20 and the material from witch is formed the spacer 22 are the same, or alternatively have no etch selectivity properties.

Figure 5:
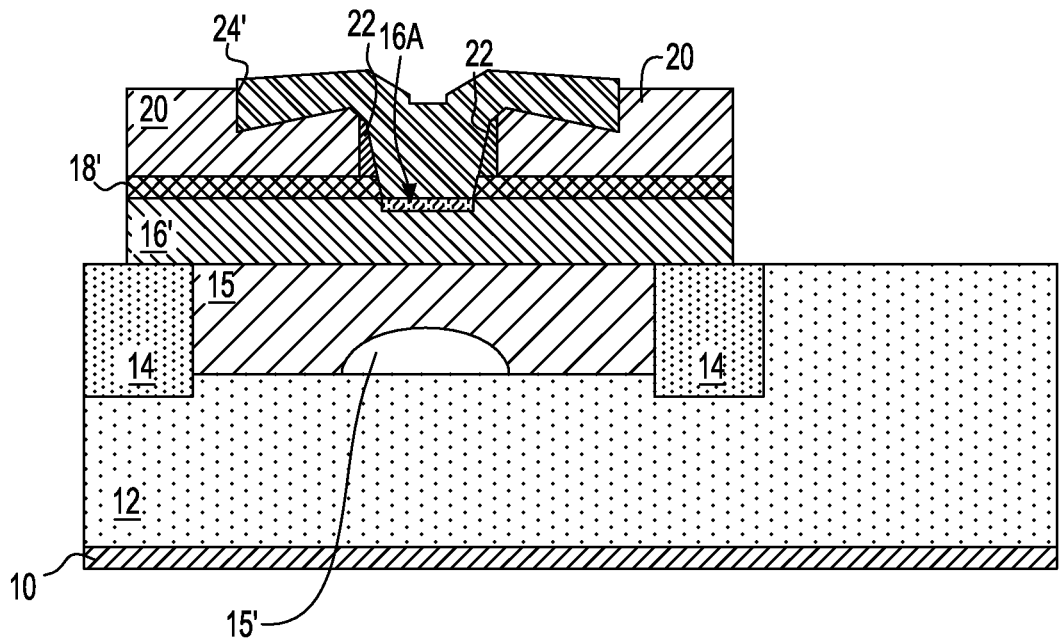
FIG. 5 shows an emitter structure located and formed within the bipolar transistor structure of FIG. 4 to provide a bipolar transistor structure in accordance with an alternate embodiment of the invention.

FIG. 5 shows an emitter layer 24' located and formed into the emitter aperture EA' that is illustrated within the bipolar transistor structure whose schematic cross-sectional diagram is illustrated in FIG. 4. In this drawing, the remaining dielectric capping layer 18" in EA' has been removed prior to forming emitter layer 24. The emitter layer 24' that is illustrated within the schematic cross-sectional diagram of FIG. 5 is otherwise analogous or functionally equivalent to the emitter layer 24 that is illustrated within the bipolar transistor structure whose schematic cross-sectional diagram is illustrated in FIG. 3, but for particular geometric and dimensional differences that derive from the presence of the spacer 22.

FIG. 5 shows a schematic cross-sectional diagram of a bipolar transistor structure in accordance with an additional embodiment of the invention that comprises an alternate first embodiment of the invention. The bipolar transistor structure in accordance with this alternate first embodiment also achieves enhanced performance of a bipolar transistor located and formed within the bipolar transistor structure incident to inclusion of an oxygen impurity, and at least one of a fluorine impurity and a carbon impurity, localized at a damaged region 16A interface between an emitter structure (i.e., emitter layer 24') and a base structure (i.e., base layer 16') and not uniformly or non-uniformly distributed in a bulk of the emitter structure and the base structure. However, this particular embodiment of the invention differs from the first embodiment by the inclusion of the spacer 22 within an emitter aperture EA'.

Figure 6:
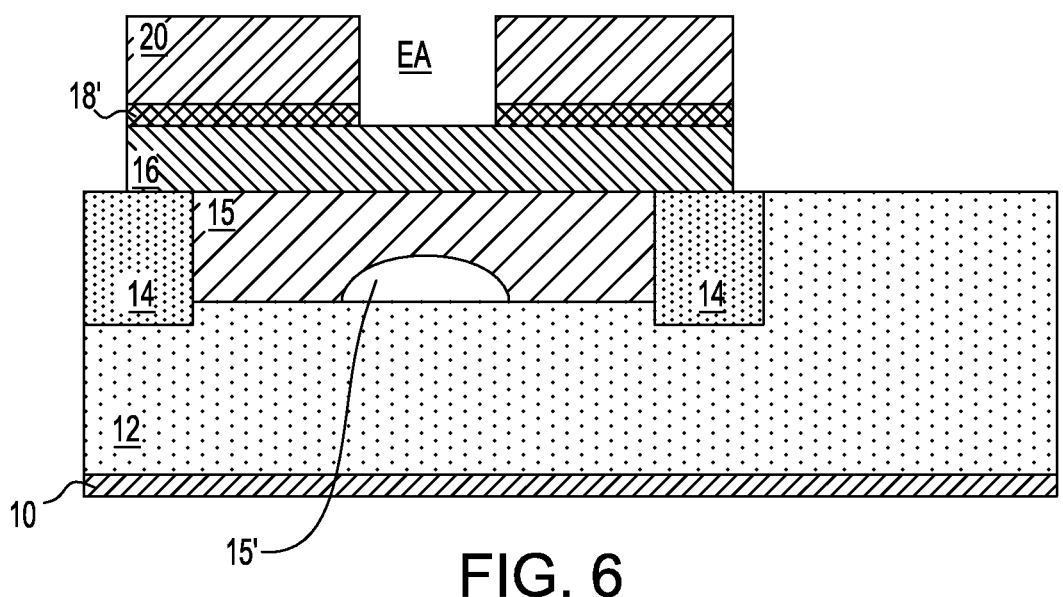
FIG. 6 shows a schematic cross-sectional diagram illustrating the results of dielectric capping layer patterning within the bipolar transistor structure of FIG. 1.

FIG. 6 shows the results of another alternative processing sequence of the bipolar transistor structure whose schematic cross-sectional diagram is illustrated in FIG. 1, to provide yet another embodiment of the invention. This other embodiment of the invention comprises a second embodiment of the invention.

FIG. 6 shows the results of patterning the dielectric capping layer 18 that is illustrated in FIG. 1, to form the dielectric capping layer 18', absent forming any damaged region within the base layer 16. Thus, at this point in the processing of the bipolar transistor structure of FIG. 6 no impurity has been incorporated into the base layer 16.

The foregoing etching of the dielectric capping layer 18 to form the dielectric capping layer 18' may be effected using methods and materials that are otherwise generally conventional in the semiconductor fabrication art. Included in particular, but also not limiting, are wet chemical etch methods and dry plasma etch methods. Wet chemical etch methods that use an aqueous hydrofluoric acid based etchant are preferred insofar as those etchants are generally specific to silicon oxide dielectric materials in comparison with silicon containing semiconductor materials.

Figure 7:
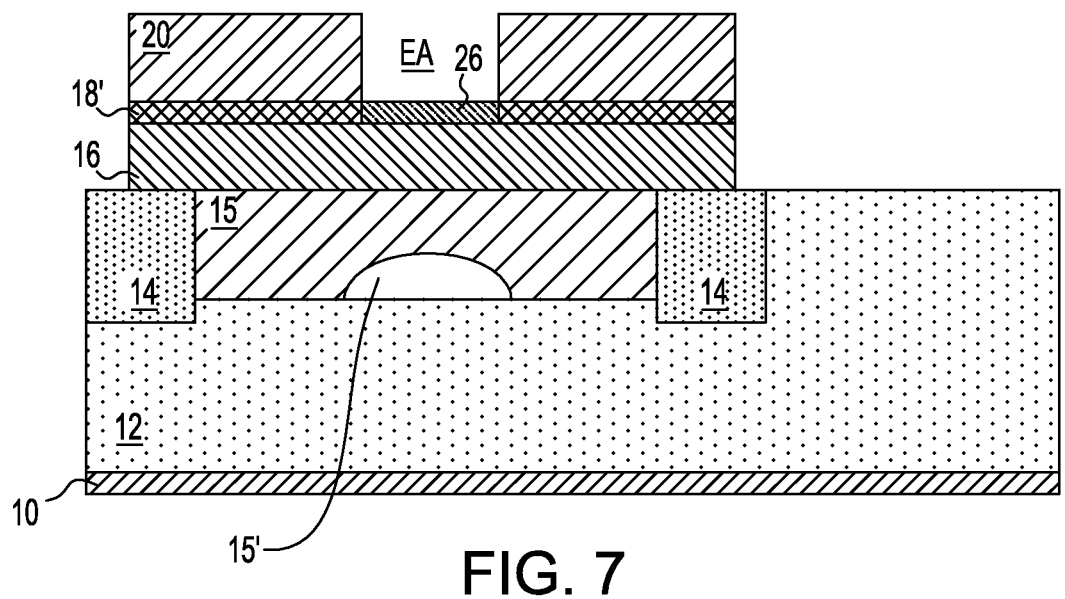
FIG. 7 shows a thermal dielectric layer located and formed within an emitter aperture within the bipolar transistor structure of FIG. 6.

FIG. 7 shows the results of thermally oxidizing the bipolar transistor structure of FIG. 6 to form a thermal oxide layer 26 located and formed upon the base layer 16 within an emitter aperture EA. Such a thermal oxidation of the bipolar transistor structure of FIG. 6 to provide the thermal oxide layer 26 located and formed upon the base layer 16 at the location of the emitter aperture EA may be undertaken using thermal annealing methods and thermal annealing materials that are otherwise generally conventional in the semiconductor fabrication art. Included in particular, but also not limiting, are rapid thermal annealing methods (i.e., at a temperature from 500 to 900 degrees centigrade for a time period from 5 to 10000 milliseconds) and furnace thermal annealing methods (i.e., at a temperature from 500 to 800 degrees centigrade for a time period from 1 to 30 minutes). Preferably, the thermal oxide layer 26 has a thickness from 2 to 20 nanometers.

Figure 8:
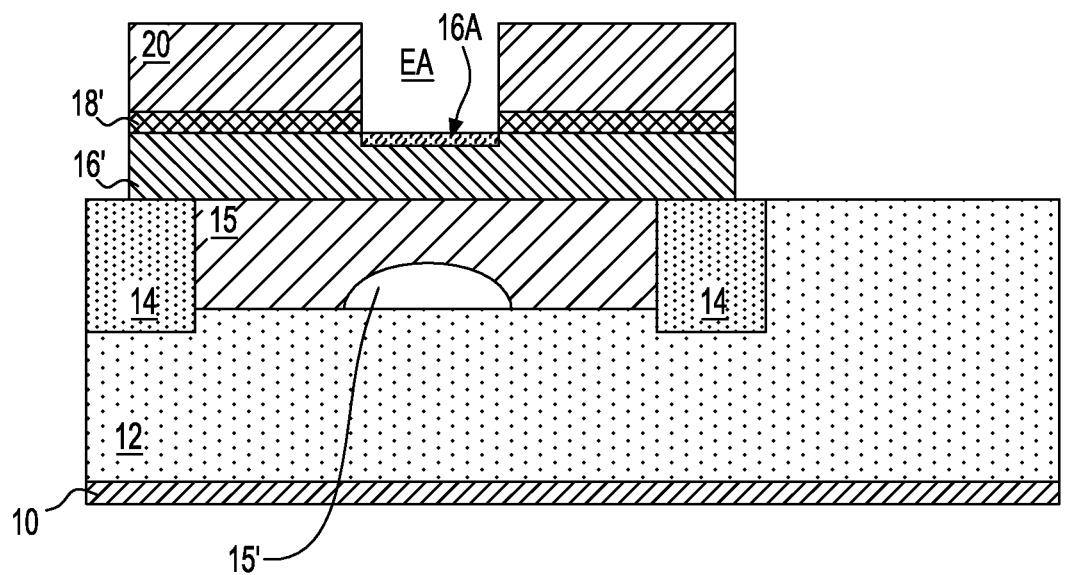
FIG. 8 shows the results of thermal dielectric layer treatment with anhydrous ammonia and anhydrous hydrogen fluoride within the bipolar transistor structure of FIG. 7.

FIG. 8 shows the results of treating the thermal dielectric 26 that is illustrated within the schematic cross-sectional diagram of FIG. 8 with an anhydrous ammonia vapor and anhydrous hydrogen fluoride vapor etchant mixture that is specific to a thermal silicon oxide dielectric material in comparison with a deposited silicon oxide dielectric material (i.e., such as is used to form the remaining portions of the dielectric capping layer 18'), to fully or partially etch the thermal oxide layer 26 and to form damaged region 16A that includes at least an oxygen impurity, and at least one of a fluorine impurity and a carbon impurity, at the surface of the base layer 16.

Typically, the anhydrous ammonia vapor and anhydrous hydrogen fluoride vapor etchant mixture is supplied to partially or fully etch the thermal oxide layer 26 at: (1) an anhydrous ammonia:anhydrous hydrogen fluoride volume ratio from 1:10 to 3:1; (2) a reactor chamber pressure from 2 to 100 mTorr; (3) a temperature from 5 to 50 degrees centigrade; and (4) a total flow rate from 1 to 100 standard cubic centimeters per minute, for a time period from 1 to 10 minutes.

Figure 9:
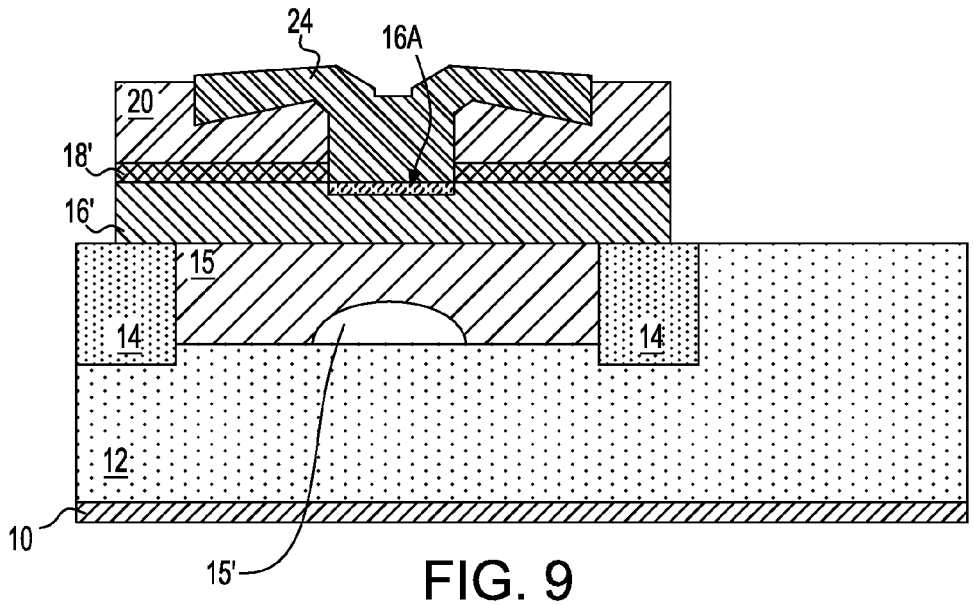
FIG. 9 shows an emitter structure located and formed within the bipolar transistor structure of FIG. 8 to provide a bipolar transistor structure in accordance with another embodiment of the invention.

FIG. 9 shows an emitter layer 24 located and formed within the emitter aperture EA that is illustrated within the schematic cross-sectional diagram of FIG. 8, to form a completed bipolar transistor structure in accordance with the second embodiment of the invention. Similarly with the first embodiment and the alternate first embodiment, performance of this particular bipolar transistor structure is enhanced due to the presence of the oxygen impurity, and the at least one of the fluorine impurity and the carbon impurity, at the interface of the emitter layer 24 (i.e., the emitter structure) and the base layer 16' (i.e., the base structure) at the location of the emitter aperture EA, absent uniform or non-uniform distribution of the impurity within other locations of the emitter structure or the base structure.

Figure 10:
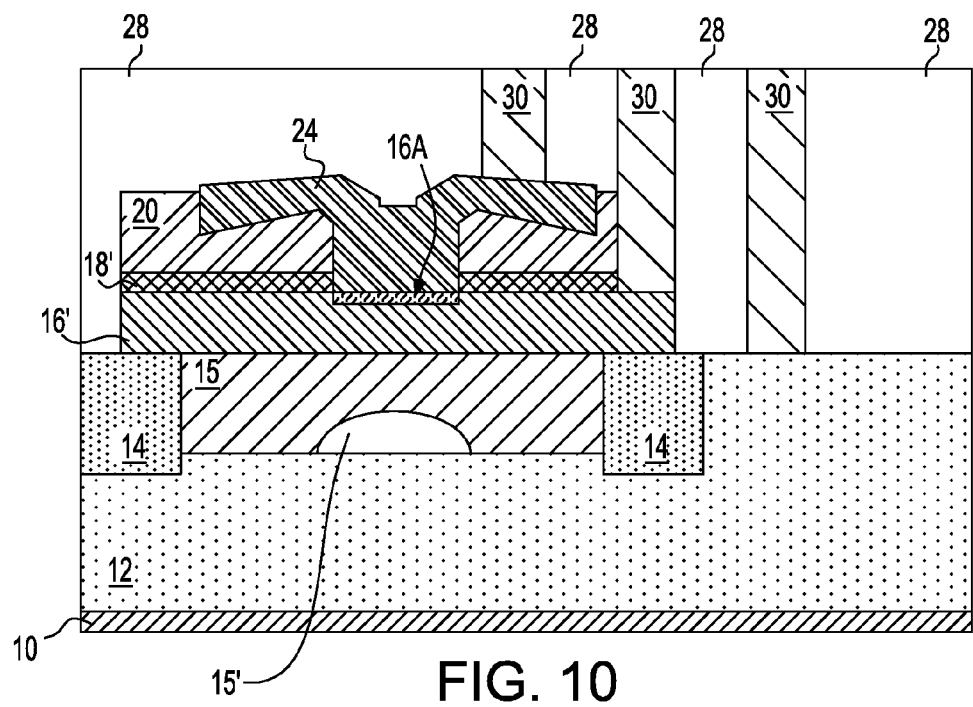
FIG. 10 shows the results of passivation layer processing and via processing within the context of the bipolar transistor structure of FIG. 9.

FIG. 10 shows a passivation layer 28 located and formed upon the bipolar transistor structure of FIG. 9. FIG. 10 also shows a plurality of vias 30 penetrating through the passivation layer 28 and individually contacting the emitter layer 24, the base layer 16 and the epitaxial sub-collector layer 12, to thus provide operative electrical connections within the bipolar transistor structure in accordance with the particular second embodiment.

The passivation layer 28 may comprise any of several passivation materials. Such passivation materials may include, but are not necessarily limited to, passivation materials that have a generally higher dielectric constant of 4 to 20, such as but not limited to silicon oxide passivation materials, silicon nitride passivation materials and silicon oxynitride passivation materials. Such passivation materials may also include, but are also not necessarily limited to, generally lower dielectric constant passivation materials having a dielectric constant less than 4, such as but not limited to spin-on-glass dielectric materials, spin-on-polymer dielectric materials, fluorosilicate glass dielectric materials and carbon doped dielectric materials. Typically, the passivation layer 28 comprises at least in-part a lower dielectric constant dielectric material that has a thickness from 200 to 2000 nanometers.

The vias 30 may comprise any of several conductor via materials that are otherwise generally conventional in the semiconductor fabrication art. Such conductor via materials may include, but are not necessarily limited to, aluminum, tungsten, copper and doped polysilicon conductor via materials, as well as alloys of the foregoing conductor via materials, composites of the foregoing conductor via materials, selected nitrides if the forgoing conductor via materials and selected silicides of the forgoing conductor via materials. Also intended to be included within the vias 30 are barrier layers as are conventional in the semiconductor fabrication art (i.e., including conductor barrier layers and dielectric barrier layers) that effectively isolate the vias 30 from the passivation layer 28.

The additional bipolar transistor structure processing that is illustrate in FIG. 10 within the second embodiment of the invention is also applicable to the bipolar transistor structure of the first embodiment that is illustrated in FIG. 3 or the bipolar transistor structure of the alternate first embodiment that is illustrated in FIG. 5.

The preferred embodiments are illustrative of the invention rather than limiting of the invention. Revisions and modifications may be made to methods, materials, structures and dimensions of a bipolar transistor structure in accordance with the preferred embodiments while still providing a bipolar transistor structure and method for fabrication thereof in accordance with the invention, further in accordance with the accompanying claims.

What is claimed is:

1. A bipolar transistor structure comprising:
a semiconductor substrate including a collector structure;
a base structure contacting the collector structure, wherein a surface of the base structure opposite the collector structure includes a damaged region extending into the base structure, wherein the damaged region includes an oxygen impurity at a concentration ranging from 4E14 to 6E14 impurity atoms per square centimeter and at least one other impurity selected from the group consisting of a fluorine impurity and a carbon impurity, wherein the at least one other impurity is present in a concentration ranging from 1E13 to 5E13 impurity atoms per square centimeter;
a dielectric layer in direct contact with an upper surface of the base structure and having an opening to an exposed portion of the damaged region of the base structure, wherein the dielectric layer extends from the opening over an entire upper surface of the base structure on each side of the opening; and
an emitter structure contacting the exposed portion of the damaged region of the base structure, wherein the exposed portion of the damaged region is present at an interface between the emitter structure and the base structure.

2. The bipolar transistor structure of claim 1 wherein the oxygen impurity and the other impurity are localized to the interface of the emitter structure and the base structure.

3. The bipolar transistor structure of claim 1 wherein the bipolar transistor structure comprises an NPN bipolar transistor structure.

4. The bipolar transistor structure of claim 1 wherein the bipolar transistor structure comprises a PNP bipolar transistor structure.

5. The bipolar transistor structure of claim 1 wherein the interface includes the oxygen impurity and the fluorine impurity.

6. The bipolar transistor structure of claim 1 wherein the interface includes the oxygen impurity and the carbon impurity.

7. The bipolar transistor structure of claim 1 wherein the interface includes the oxygen impurity, the fluorine impurity and the carbon impurity.

8. The bipolar transistor structure of claim 1 wherein:
the base structure includes at least in-part a monocrystalline base material;
the emitter structure includes a polycrystalline emitter material.

9. The bipolar transistor structure of claim 1 wherein the emitter structure is in-part separated from the base structure by an emitter isolation layer that includes a spacer.

10. A method for fabricating a bipolar transistor structure comprising:
forming at least in-part within a semiconductor substrate a collector structure;
forming a base structure contacting the collector structure;
forming a dielectric layer directly on an entire upper surface of the base structure;
forming an opening through a portion of the dielectric layer to provide an exposed surface of the base structure;
forming a damaged region on the exposed surface of the base structure, wherein the damaged region extends into the base structure, and includes an oxygen impurity at a concentration ranging from 4E14 to 6E14 impurity atoms per square centimeter and at least one other impurity selected from the group consisting of a fluorine impurity and a carbon impurity, wherein the at least one other impurity is present in a concentration ranging from 1E13 to 5E13 impurity atoms per square centimeter; and forming an emitter structure contacting the damaged region of the base structure.

11. The method of claim 10 wherein the oxygen impurity and the other impurity are not uniformly distributed within the base structure.

12. The method of claim 10 wherein the forming the base structure provides at least in-part a monocrystalline base material.

13. The method of claim 12 wherein the monocrystalline base material is treated with an etching plasma to provide the oxygen impurity and the at least one other impurity.

14. The method of claim 12 wherein the monocrystalline base material is thermally oxidized and then treated with an anhydrous ammonia vapor and anhydrous hydrogen fluoride vapor etchant to provide the oxygen impurity and the at least one other impurity.

15. The method of claim 10 wherein the interface includes the oxygen impurity and the fluorine impurity or the interface includes the oxygen impurity and the carbon impurity.

16. A method for fabricating a bipolar transistor structure comprising:

forming at least in-part within a semiconductor substrate a collector structure;

forming a base structure of a monocrystalline base material contacting the collector structure;

forming a dielectric layer directly on an entire upper surface of the base structure;

forming an opening through a portion of the dielectric layer to provide an exposed surface of the base structure;

forming a damaged region on the exposed surface of the monocrystalline base material, wherein the damaged region extends into the base structure, and includes an oxygen impurity at a concentration ranging from 4E14 to 6E14 impurity atoms per square centimeter and at least one other impurity selected from the group consisting of a fluorine impurity and a carbon impurity, wherein the at least one other impurity is present in a concentration ranging from 1E13 to 5E13 impurity atoms per square centimeter;

applying an aqueous hydrofluoric etchant to the exposed surface of the monocrystalline base material to increase a concentration of the oxygen impurity and a concentration of said at least one other impurity selected from the group consisting of the fluorine impurity and the carbon impurity; and forming an emitter structure contacting the interface surface of the base structure.

* * * * *